United States Patent
Kuo

(10) Patent No.: US 9,116,172 B2
(45) Date of Patent: Aug. 25, 2015

(54) CONNECTOR FOR ACTUATOR OF CAMERA

(71) Applicant: HON HAI PRECISION INDUSTRY CO., LTD., New Taipei (TW)

(72) Inventor: Chang-Wei Kuo, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 123 days.

(21) Appl. No.: 13/858,907

(22) Filed: Apr. 8, 2013

(65) Prior Publication Data

US 2014/0159760 A1    Jun. 12, 2014

(30) Foreign Application Priority Data

Dec. 7, 2012    (TW) .............................. 101146285 A

(51) Int. Cl.
*G01R 31/00* (2006.01)
*G01R 1/04* (2006.01)

(52) U.S. Cl.
CPC .................................... *G01R 1/0416* (2013.01)

(58) Field of Classification Search
USPC ............. 324/755.01, 755.04, 755.05, 757.01; 248/309.4; 379/433.13; 439/495, 496, 439/497

See application file for complete search history.

(56) References Cited

U.S. PATENT DOCUMENTS

| | | | |
|---|---|---|---|
| 6,305,656 B1 * | 10/2001 | Wemyss | 248/309.4 |
| 7,489,778 B2 * | 2/2009 | Lee | 379/433.13 |
| 7,623,782 B2 * | 11/2009 | Yu | 396/542 |
| 7,959,453 B2 * | 6/2011 | Guering | 439/165 |
| 8,030,957 B2 * | 10/2011 | Lindsey et al. | 324/755.01 |
| 8,228,085 B2 * | 7/2012 | Lindsey et al. | 324/755.01 |
| 8,267,717 B2 * | 9/2012 | Ishishita et al. | 439/495 |
| 8,628,336 B2 * | 1/2014 | Richmond et al. | 439/70 |
| 8,747,123 B2 * | 6/2014 | Richmond et al. | 439/70 |

* cited by examiner

*Primary Examiner* — Minh N Tang
*Assistant Examiner* — Suresh K Rajaputra
(74) *Attorney, Agent, or Firm* — Novak Druce Connolly Bove + Quigg LLP

(57) ABSTRACT

A connector includes a support and an arm. The support is to support a to-be-test workpiece. The arm is rotatably connected to the support and includes a number of probes. Pinheads of the probes faces the support. When the arm is rotated to a predetermined position relative to the support, the pinheads of the probes contacts with a flexible printed circuit (FPC) of the to-be-tested workpiece.

15 Claims, 2 Drawing Sheets

CONNECTOR FOR ACTUATOR OF CAMERA

BACKGROUND

1. Technical Field

The present disclosure relates to connectors, and particularly to a connector used for testing actuators of cameras.

2. Description of Related Art

For electrically testing camera actuators, a general connector known in the camera industry is used to connect gold fingers of a flexible printed board (FPC) of the actuator to be tested to a test board. However, for some special actuators, for example, socket type actuators, are manufactured so small now that their FPCs are too small to be reliably connected to the test board by the general connector, making reliable testing difficult.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
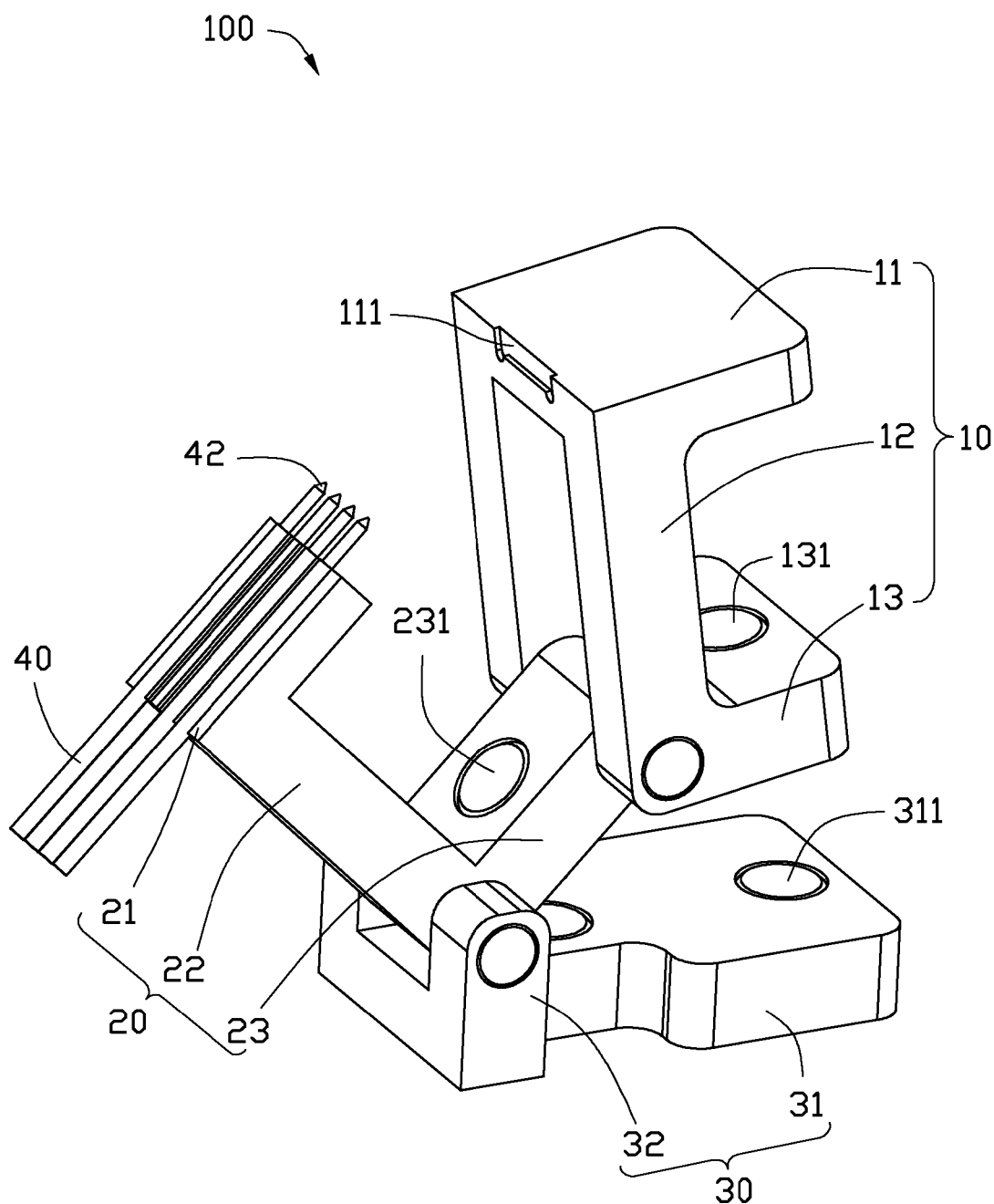
FIG. 1 is an isometric view of a connector for an actuator of a camera, in accordance with an exemplary embodiment.
Figure 2:
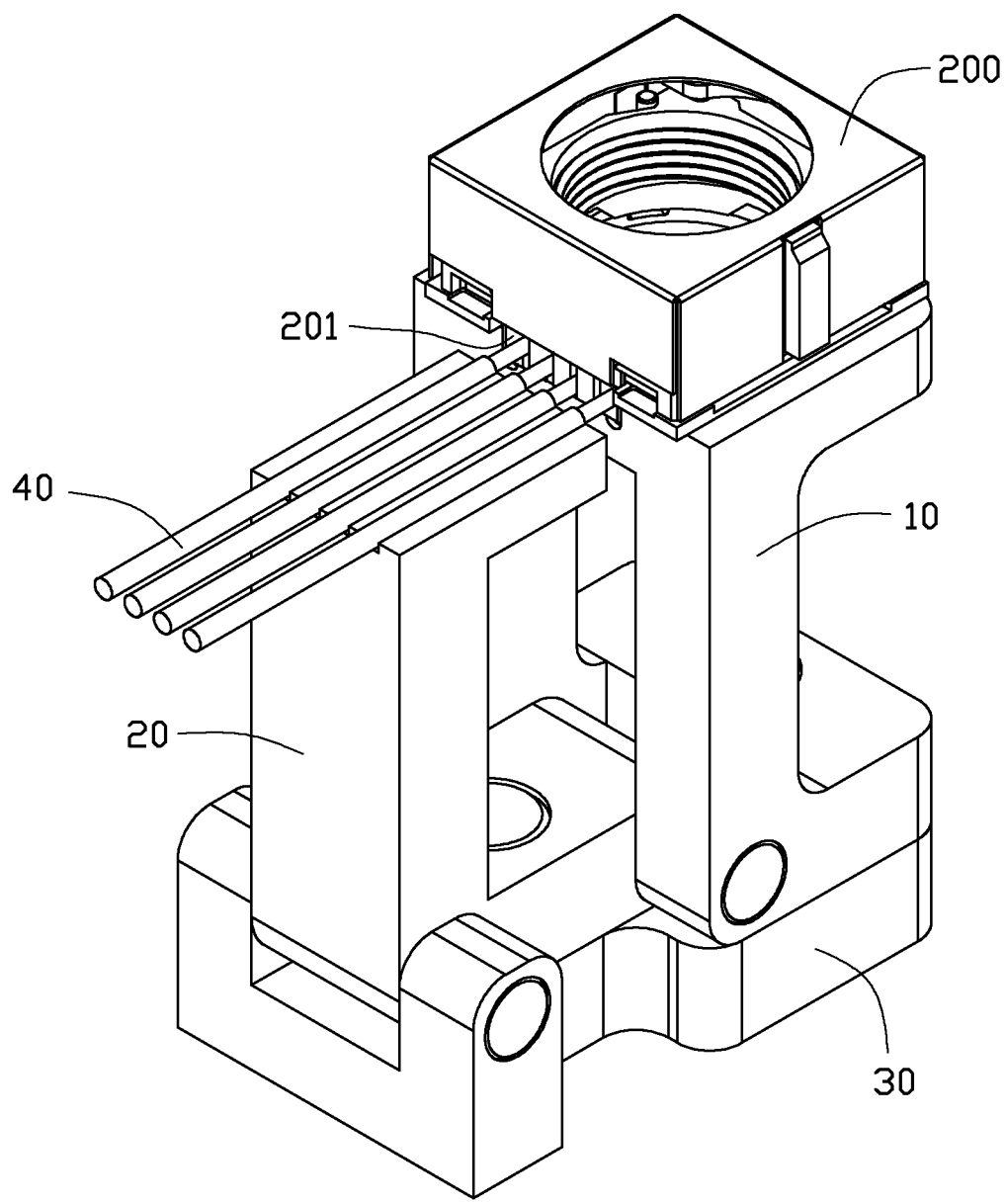
FIG. 2 is another isometric view of the connector of FIG. 1, showing the connector connected to a to-be-tested actuator.

Referring to FIGS. 1-2, an embodiment of a connector 100 includes a support 10, an arm 20 rotatably connected to the support 10, and a base 30 rotatably connected to the arm 20. The support 10 is used to support a to-be-tested workpiece 200. In this embodiment, the to-be-tested workpiece 200 is an actuator of a camera.

The support 10 includes a first top portion 11, a first bottom portion 13 parallel to the first top portion 11, and a first connecting portion 12 perpendicularly connecting the first top portion 11 to the first bottom portion 13. A sidewall of the first top portion 11 defines a recess 111. The recess 111 is to receive a FPC of the to-be-tested actuator 200. A magnetic element 131 is arranged in the first bottom portion 13.

The arm 20 includes a second top portion 21, a second bottom portion 23, and a second connecting portion 22 perpendicularly connecting the second top portion 21 to the second bottom portion 23. A first end of the second bottom portion 23 away from the second connecting portion 22 is rotatably connected to an end of the first connecting portion 12. When the arm 20 is connected to the support 10, the arm 20 faces the recess 111. A number of probes 40 are arranged on the second top portion 21, and pinheads 42 of the probes 40 face the recess 111. In this embodiment, the height of the arm 20 is a little less than the height of the support 10. When the arm 20 is rotated to a predetermined position relative to the support 10, the pinheads 42 of the probes 40 are received in the recess 111. In this embodiment, when the arm 220 is rotated to the predetermined position relative to the support 10, the second top portion 21 is parallel to the first top portion 11. A number of magnetic elements 231 are arranged in the second bottom portion 23.

The base 30 includes a third bottom portion 31 and a third connecting portion 32 perpendicularly connected to the third bottom portion 31. The third connecting portion 32 is rotatably connected to a second end of the second bottom portion 31. Two magnetic elements 311 are arranged in the third bottom portion 31, one is used to attract the magnetic element 131, and another is used to attract the magnetic element 231.

To electrically test the actuator 200, the actuator 200 is placed on the first top portion 11, and the FPC 201 of the to-be-tested actuator 200 is placed in the recess 111. The arm 20 is then rotated to the predetermined position relative to the support 11, and the pinheads 42 of the probes 40 contact gold fingers of the FPC 201. The attraction between the magnetic elements 311 and 131 and the attraction between the magnetic elements 311 and 231 cause the first bottom portion 13 and the second bottom portion 23 to be arranged on the base 30. With the attraction between the magnetic elements 131, 231, and 311, the arm 20 cannot be easily rotated, thus during the electrical test, the pinheads 42 of the probes 40 can remain in contact with the gold fingers of the FPC 301. With such configuration, the connector 100 can even be used for electrically testing actuators 200 having very small FPCs.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A connector comprising:
   a support comprising a first top portion to support a to-be-test workpeice, a first bottom portion parallel to the first top portion, and a first connecting portion perpendicularly connecting the first top portion to the first bottom portion; and
   an arm comprising a second top portion, a second bottom portion parallel to the second top portion, a second connecting portion perpendicularly connecting the second top portion to the second bottom portion, and a plurality of probes, the first bottom portion rotatably connected to the second bottom portion, pinheads of the plurality of probes facing the support; and
   a base comprising a third bottom portion and a third connecting portion, the third bottom portion comprising a supporting surface, the third connecting portion perpendicularly extending from the supporting surface toward the arm, the second bottom portion rotatably connected to the third connecting portion; when the arm is rotated to a predetermined position relative to the support, the pinheads of the plurality of probes contacting with a flexible printed circuit (FPC) of the to-be-tested workpiece supported by the support, and the first bottom portion and the second bottom portion are located on and contact the supporting surface.

2. The connector as described in claim 1, wherein the second bottom portion comprises a first end connected to the second connecting portion and a second end opposite to the first end, the second end of the second bottom portion is rotatably connected to an end of the first bottom portion connected to the first connecting portion, the first top portion defines a recess to receive the FPC of the to-be-tested workpiece, the plurality of probes are arranged on the second top portion, and the pinheads of the plurality of probes face the recess.

3. The connector as described in claim 2, wherein the first bottom portion, the second bottom portion, and the third bottom portion respectively comprises magnetic elements, and the magnetic element of the third bottom portion attracts the magnetic elements of the first bottom portion and the second bottom portion.

4. The connector as described in claim 2, wherein when the arm is rotated to the predetermined position relative to the support, the second top portion of the arm is parallel to the first top portion of the support.

5. The connector as described in claim 2, wherein the first top portion comprises an upper surface and a side surface connecting to the upper surface and facing toward the arm, and the recess is defined in the side surface and passes through the upper surface.

6. The connector as described in claim 1, wherein a lower surface of the first bottom portion and a lower surface of the second bottom portion are coplanar with the supporting surface.

7. The connector as described in claim 1, wherein the second top portion comprises a top surface, a first side surface facing toward the support, and a second side surface facing away the support, the top surface is interconnected between the first side surface and the second side surface, a plurality of receiving grooves are defined in the top surface and pass through the first side surface and the second side surface, the probes are received in the receiving grooves, and the pinheads are exposed at the first side surface.

8. The connector as described in claim 1, wherein the height of the arm is little less than the height of the support.

9. A connector comprising:
a support comprising a first top portion to support a to-be-test workpeice, a first bottom portion parallel to the first top portion, a first connecting portion perpendicularly connecting the first top portion to the first bottom portion, and a magnetic element; and
an arm comprising a second top portion, a second bottom portion parallel to the second top portion, a second connecting portion perpendicularly connecting the second top portion to the second bottom portion, a plurality of probes and a magnetic element, the first bottom portion rotatably connected to the second bottom portion, pinheads of the plurality of probes facing the support, when the arm is rotated to a predetermined position relative to the support, the pinheads of the plurality of probes contacting with a flexible printed circuit (FPC) of the to-be-tested workpiece; and
a base comprising a magnetic element, a third bottom portion, and a third connecting portion, the third bottom portion comprising a supporting surface, the third connecting portion perpendicularly extending from the supporting surface toward the arm, the second bottom portion rotatably connected to the third connecting portion, the magnetic element of the base attracting the magnetic elements of the support and the arm, and the first bottom portion and the second bottom portion are located on and contact the supporting surface.

10. The connector as described in claim 9, wherein the second bottom portion comprises a first end connected to the second connecting portion and a second end opposite to the first end, the second end of the second bottom portion is rotatably connected to an end of the first bottom portion connected to the first connecting portion, the first top portion defines a recess to receive the FPC of the to-be-tested workpiece, the plurality of probes are arranged on the second top portion, and the pinheads of the plurality of probes face the recess.

11. The connector as described in claim 10, wherein when the arm is rotated to the predetermined position relative to the support, the second top portion of the arm is parallel to the first top portion of the support.

12. The connector as described in claim 10, wherein the first top portion comprises an upper surface and a side surface connecting to the upper surface and facing toward the arm, and the recess is defined in the side surface and passes through the upper surface.

13. The connector as described in claim 9, wherein a lower surface of the first bottom portion and a lower surface of the second bottom portion are coplanar with the supporting surface.

14. The connector as described in claim 9, wherein the second top portion comprises a top surface, a first side surface facing toward the support, and a second side surface facing away the support, the top surface is interconnected between the first side surface and the second side surface, a plurality of receiving grooves are defined in the top surface and pass through the first side surface and the second side surface, the probes are received in the receiving grooves, and the pinheads are exposed at the first side surface.

15. The connector as described in claim 9, wherein the height of the arm is little less than the height of the support.

* * * * *